US010976506B2

(12) United States Patent
Matsui

(10) Patent No.: US 10,976,506 B2
(45) Date of Patent: Apr. 13, 2021

(54) OPTICAL TRANSCEIVER

(71) Applicant: Sumitomo Electric Industries, Ltd., Osaka (JP)

(72) Inventor: Takashi Matsui, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/850,736

(22) Filed: Apr. 16, 2020

(65) Prior Publication Data

US 2020/0333539 A1 Oct. 22, 2020

(30) Foreign Application Priority Data

Apr. 22, 2019 (JP) .............................. JP2019-081239

(51) Int. Cl.
*G02B 6/36* (2006.01)
*G02B 6/42* (2006.01)
*H05K 1/14* (2006.01)

(52) U.S. Cl.
CPC .......... *G02B 6/4204* (2013.01); *G02B 6/428* (2013.01); *G02B 6/4249* (2013.01); *G02B 6/4266* (2013.01); *G02B 6/4284* (2013.01); *G02B 6/4292* (2013.01); *H05K 1/141* (2013.01); *H05K 1/147* (2013.01); *H05K 2201/10121* (2013.01)

(58) Field of Classification Search
CPC .. G02B 6/4204; G02B 6/4249; G02B 6/4266; G02B 6/428; G02B 6/4284; G02B 6/4292; G02B 6/4268; G02B 6/3885; H05K 1/147; H05K 1/141; H05K 2201/10121
See application file for complete search history.

(56) References Cited

U.S. PATENT DOCUMENTS

| 2013/0022360 A1* | 1/2013 | Matsui | G02B 6/4201 398/116 |
| 2015/0256259 A1* | 9/2015 | Huang | G01J 1/0271 398/88 |
| 2016/0231521 A1* | 8/2016 | Smith | G02B 6/4214 |
| 2016/0246019 A1 | 8/2016 | Ishii et al. | |

FOREIGN PATENT DOCUMENTS

| JP | 2010-122311 A | 6/2010 |
| JP | 2016-156916 A | 9/2016 |

\* cited by examiner

*Primary Examiner* — Ellen E Kim

(74) *Attorney, Agent, or Firm* — Baker Botts L.L.P.; Michael A. Sartori

(57) ABSTRACT

An optical transceiver according to an embodiment includes an optical receptacle, two optical sub-assemblies, and a circuit board having a upper surface, on which the optical sub-assembly on the rear side is installed on the opposite side of an external connector to the optical receptacle on the upper surface and the optical sub-assembly on the front side is installed between the optical receptacle and the optical sub-assembly on the rear side on the upper surface. Each of the optical sub-assemblies includes an optical sub-assembly substrate on which an optical device is mounted, a lens part that covers the optical device and that is optically coupled to the optical receptacle, and a frame. A part of the frame of the optical sub-assembly on the front side is pressed by the optical sub-assembly substrate of the optical sub-assembly on the rear side toward the circuit board.

7 Claims, 11 Drawing Sheets

US 10,976,506 B2

OPTICAL TRANSCEIVER

TECHNICAL FIELD

An aspect of the present disclosure relates to an optical transceiver.

BACKGROUND

Japanese Unexamined Patent Publication No. 2010-122311 describes an optical module including a circuit board, an optical element that transmits or receives a plurality of optical signals, and a lens block that is optically coupled to the optical element and installed on the circuit board. With the lens block, a ferrule engages that retains an optical fiber, into which the optical fiber is inserted. The optical transceiver has a receptacle part including a ferrule that accepts an external MPO connector. The ferrule of the receptacle part is connected to the ferrule that engages with the lens block through a plurality of optical fibers.

Japanese Unexamined Patent Publication No. 2016-156916 describes an optical transceiver including an optical receptacle that accepts an external MPO connector, an assembly substrate on which a semiconductor optical element that has a photoelectric conversion function and laser driver are installed, and a main circuit board on which electronic devices are mounted. The assembly substrate and the main circuit board are protected by a housing. On the assembly substrate, a photoelectric conversion component and a holder are installed, and the holder retains the photoelectric conversion component on the assembly substrate. An MT ferrule engages with the inside of the optical receptacle and an MT ferrule engages with the photoelectric conversion component. The MT ferrule in the inside of the optical receptacle is optically coupled to the MT ferrule that engages with the photoelectric conversion component through an internal fiber.

SUMMARY

An optical transceiver according to an aspect of the present disclosure is an optical transceiver configured to be plugged into a cage of an apparatus in a first direction. The optical transceiver includes an optical receptacle configured to receive an external optical connector; a circuit board having a first side, the circuit board including an electric circuit processing an electrical signal; a first optical sub assembly (OSA) and a second OSA each including: a sub-board having an upper surface, the upper surface having an area smaller than an area of the first side of the circuit board; an optical device mounted on the upper surface, the optical device configured to perform an conversion between the electrical signal and an optical signal; an optical block mounted on the upper surface, the optical block being optically coupled with the optical device; and a frame configured to fix the optical block on the upper surface; a first optical fiber coupling the first OSA with the optical receptacle; a second optical fiber coupling the second OSA with the optical receptacle; and a housing including the circuit board, the first OSA, the second OSA, the first optical fiber, and the second optical fiber. The first OSA is located between the optical receptacle and the second OSA in the first direction on the first side of the circuit board. The second OSA pushes the first OSA toward the first side of the circuit board.

DETAILED DESCRIPTION

Detail of Embodiment

Figure 1:
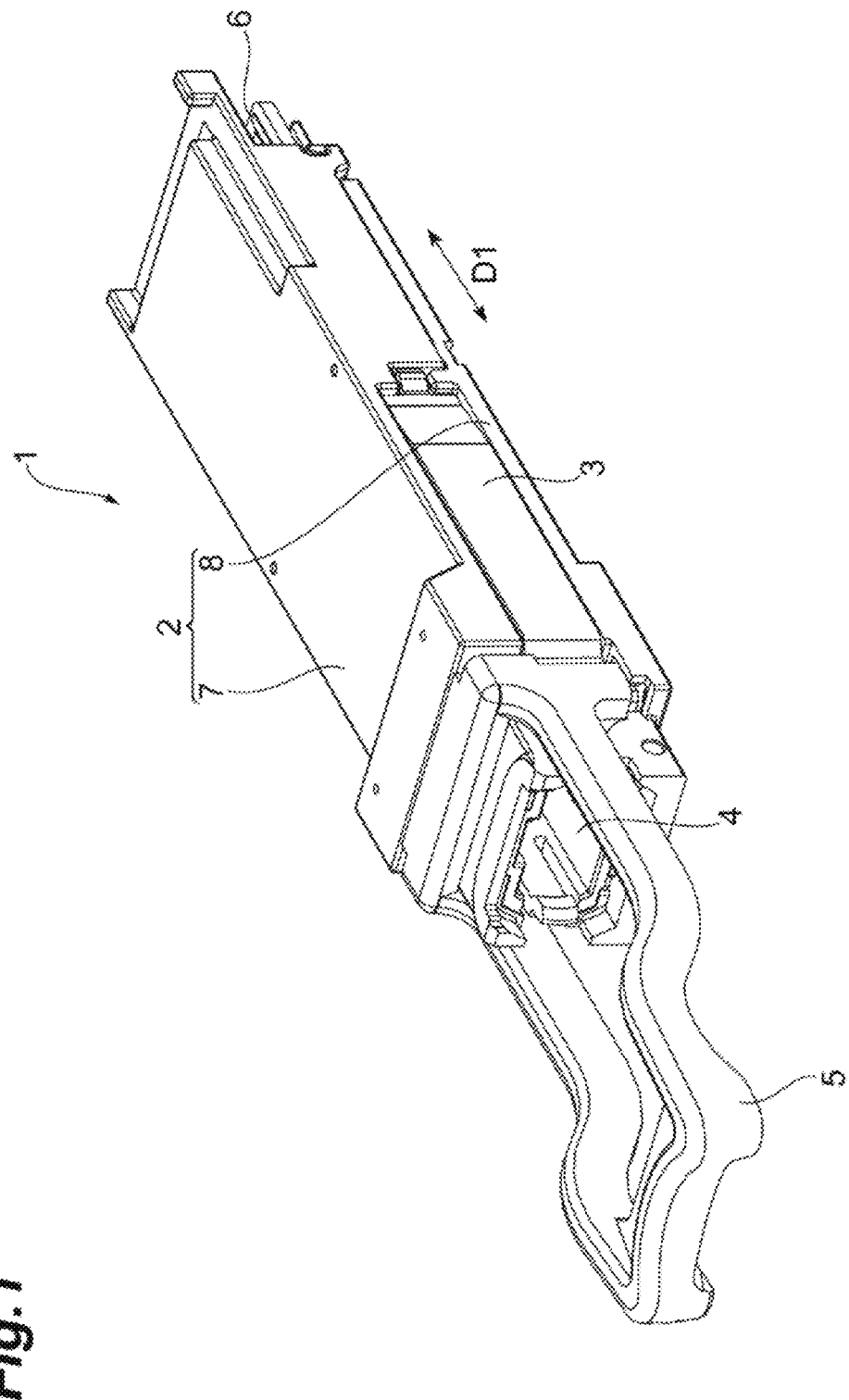
FIG. 1 is a perspective view showing an optical transceiver according to an embodiment of the present disclosure.

In the following, a specific example of an optical transceiver according to an embodiment will be described with reference to the drawings. Note that the present invention is not limited to the following example, and the present invention is intended to include all modifications shown by claims and in the scope equivalent to the scope of claims. In the description of the drawings, the same or corresponding components are designated with the same reference signs, and the duplicate description is appropriately omitted. For easy understanding, the drawings are sometimes simplified or exaggerated, dimensions, ratios, and any other parameters are not limited to those shown in the drawings.

FIG. 1 is a perspective view showing an optical transceiver 1 according to an embodiment. As shown in FIG. 1, the optical transceiver 1 is in compliance with the QSFP specification, for example. The specification referred here is MSA (Multi Source Agreement) that is one of the industrial specifications, for example. The optical transceiver 1 includes a metal housing 2, a slider 3 that engages with the housing 2, an optical receptacle 4 that is located at one end of the housing 2, and a pull-tab 5 that extends from the slider 3. The housing 2 shows a rectangular cuboid shapes and extends long in one direction D1. The optical transceiver 1 is hot swapped (inserted into and extracted from) a cage provided on a host system (a communication apparatus) along the one direction D1. The cage has a rectangular cuboid shape, and its inside is hollow, and one end in the longitudinal direction (the direction is matched with the one direction D1) has an opening. The cage is disposed on the apparatus such that the opening faces the outside of the apparatus. The housing 2 can be inserted from the outside of the apparatus into the opening. The one direction D1 is an insertion-and-removal direction in which the optical transceiver 1 is hot swapped to the cage. The part that is inserted into the cage is mainly the housing 2, and the optical receptacle 4 and the pull-tab 5 are exposed to the outside of the cage. When the optical transceiver 1 is inserted into the cage, the optical transceiver 1 moves such that one end, at which the optical receptacle 4 is provided, in the one direction D1 that is the longitudinal direction of the housing 2 and the other end located on the opposite side to the one end are brought close to the cage. At the time at which the optical transceiver 1 is extracted (pulled out) from the cage, the optical transceiver 1 moves such that one end of the housing 2, at which the optical receptacle 4 is provided, is away from the cage.

The slider 3 extends from one end of the housing 2, at which the optical receptacle 4 is provided, along the one direction D1. The optical receptacle 4 accepts the MT ferrule of an external optical connector, and externally transmits and receives optical signals through the optical connector. The housing 2 includes an electrical plug 6 that is connected to an electrical connector provided in the inside of the cage at the other end located on the opposite side to one end, at which the optical receptacle 4 is provided. That is, when the optical transceiver 1 is inserted into the cage, the housing 2 is inserted along the one direction D1 from the other end side where the electrical plug 6 is provided. After the housing 2 is inserted into the cage, a state is achieved in which the electrical connector is fit into the electrical plug 6 and fails to further push the electrical plug 6. In this state, the optical transceiver 1 engages with the cage, and is not allowed to be pulled out even though only the housing 2 is held and tried to be pulled out. The electrical plug 6 is fit into the electrical connector, electric power is supplied from the host system to the optical transceiver 1, and thus the transmission and reception of electrical signals between the communication apparatus and the optical transceiver 1. The pull-tab 5 is made of a resin, for example, and is formed of a flexible material. The pull-tab 5 is held and the pull-tab 5 is pulled to opposite side to the cage, and thus the engagement of the optical transceiver 1 with the cage is released and the optical transceiver 1 can be pulled out of the host system.

The housing 2 shows a rectangular cuboid shape. For example, the cross sectional form of the housing 2 when the housing 2 is cut in a plane extending vertically in the one direction D1 is a rectangular shape. The housing 2 includes an upper housing 7 and a lower housing 8, and the slider 3 is provided between the upper housing 7 and the lower housing 8. The upper housing 7 and the lower housing 8 are joined to each other with a plurality of screws in the state in which a gasket is interposed, for example. In the following description, the terms "front and rear" directions and "above and below" directions are sometimes used. However, these directions are set for convenience based on the states shown in the drawings, and do not limit the directions. In the following description, the optical receptacle 4 side is referred to as "front", the electrical plug 6 side is "rear", the direction in which the upper housing 7 is viewed from the lower housing 8 is "above", the direction in which the lower housing 8 is viewed from the upper housing 7 is "below", and "above and below" is sometimes referred to as "height".

Figure 2:
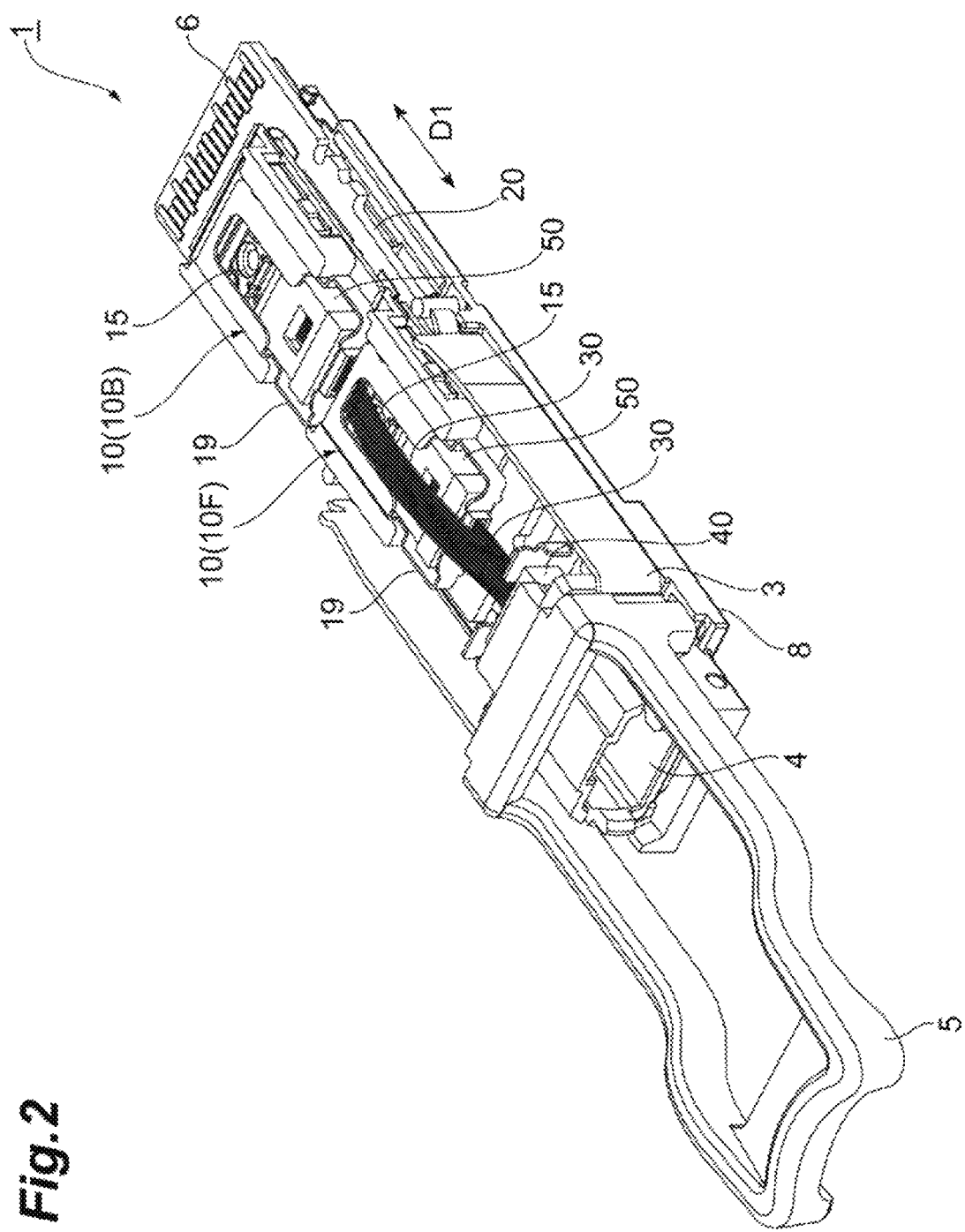
FIG. 2 is a perspective view showing an internal structure of the optical transceiver in FIG. 1.

FIG. 2 is a perspective view of the optical transceiver 1 viewed from above with the upper housing 7 removed from the optical transceiver 1. As shown in FIG. 2, in the inside of the optical transceiver 1, two optical sub-assemblies 10, a circuit board 20 on which the two optical sub-assemblies 10 are installed, a plurality of optical fibers 30 that extends from the optical receptacle 4, a ferrule 40 that is accommodated in the inside of the optical receptacle 4, and a ferrule 50 that is retained on the optical sub-assemblies 10 are provided. The two optical sub-assemblies 10 are disposed being arrayed along the one direction D1. For example, in the two optical sub-assemblies 10, one (the optical sub-assembly on the rear side) is disposed on the electrical plug 6 side, and the other (the optical sub-assembly on the front side) is disposed between the one (the optical sub-assembly on the rear side) and the optical receptacle 4. In the following, the optical sub-assembly 10 on the rear side is sometimes referred to as an optical sub-assembly 10B, and the optical sub-assembly 10 on the front side is referred to as an optical sub-assembly 10F. The plurality of optical fibers 30 is retained on the ferrule 40 and the ferrule 50. A part of the plurality of optical fibers 30 extends from the ferrule 40 to the ferrule 50 retained on the optical sub-assembly 10F (the first optical sub-assembly). The remaining part of the plurality of optical fibers 30 extends from the ferrule 40 to the ferrule 50 retained on the optical sub-assembly 10B (the second optical sub-assembly). The plurality of optical fibers 30 that optically couples the optical receptacle 4 to the optical sub-assembly 10F corresponds to a first multicore optical fiber, and the plurality of optical fibers 30 that optically couples the optical receptacle 4 to the optical sub-assembly 10B corresponds to a second multicore optical fiber. That is, the plurality of optical fibers 30 includes the first multicore optical fiber and the second multicore optical fiber. To the optical receptacle 4, an optical fiber that is fit into the MT ferrule of the external connector and retained on the MT ferrule is optically coupled to the optical fiber 30 that is retained on the ferrule 40. Note that the term "optically coupled" or "to be optically coupled" expresses the state in which optical signals are appropriately transmitted from one of optical components that are connected to each other to the other or from the other to one within a predetermined attenuation. What degree of attenuation is allowed is determined corresponding to the intensity of optical signals to be transmitted. For example, the coupling attenuation of the MT connector is one decibel or less.

Figure 3:
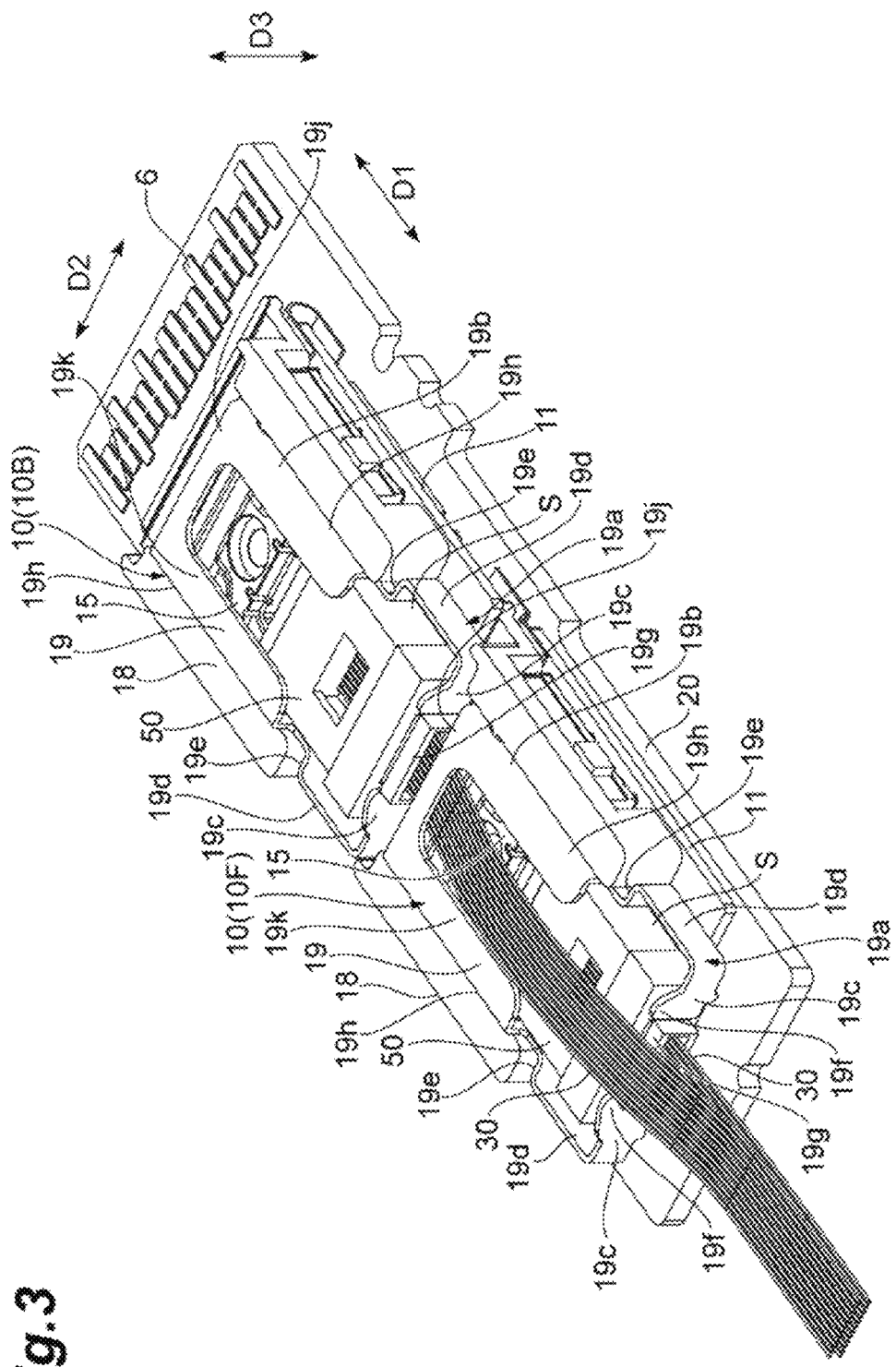
FIG. 3 is a perspective view showing two optical sub-assemblies, a plurality of optical fibers, and a circuit board of the optical transceiver in FIG. 1.

FIG. 3 is a perspective view of the two optical sub-assemblies 10, the circuit board 20, the optical fibers 30, and the ferrule 50 that are enlarged. As shown in FIGS. 2 and 3, from the ferrule 40, pluralities of optical fibers 30 extend on the rear side toward the two optical sub-assemblies 10. The pluralities of optical fibers 30 extending from the ferrule 40 are arrayed along a direction D2 that is the width direction of the optical transceiver 1, for example, and along the direction D3 that is the vertical direction (the height direction) of the optical transceiver 1. As an example, from the ferrule 40, two sets of 12 optical fibers 30 arrayed in the direction D2 extend along the direction D3, which are 24 optical fibers 30 in total. For example, 24 optical fibers 30 and the ferrule 40 constitute a 24-core MPO connector.

Note that at least a part of the plurality of optical fibers 30 may be formed in a tape. The term "formed in a tape" expresses an optical fiber 30 that is a ribbon fiber, or a plurality of optical fibers 30 that is ribbonized. The ribbon fiber is a plurality of optical fibers 30 in which a plurality of optical fibers 30 is arrayed in a predetermined direction (e.g. the direction D2 and the direction D3) and fixed in advance. The term "ribbonized" expresses a plurality of optical fibers 30 that is fixed with an adhesive, for example, in the state in which the plurality of optical fibers 30 is arrayed along a predetermined direction. For example, the 12 optical fibers arrayed along the direction D2 may be adhered such that the adjacent optical fibers are adhered to each other. For example, the plurality of optical fibers 30 may be two ribbon fibers each formed of 12 optical fibers which are arrayed along the direction D2. Note that the ribbon fiber is sometimes referred to as a ribbon cable. In two sets of optical fibers 30 (ribbon fibers) arrayed along the direction D3, a set of optical fibers 30 (ribbon fiber) on the lower side extends to the ferrule 50 of the optical sub-assembly 10F. For example, the 12 optical fibers 30 and the ferrule 50 constitute a 12-core MPO connector. In the two sets of optical fibers 30 (ribbon fibers) arrayed along the direction D3, a set of optical fibers 30 (ribbon fiber) on the upper side extends on the rear side beyond the ferrule 50 on the front side, and the rear end of the set of optical fibers 30 on the upper side extends to the ferrule 50 of the optical sub-assembly 10B.

The two optical sub-assemblies 10 have the same configuration, for example. The optical sub-assembly 10 includes an optical sub-assembly substrate 11 (sub-board), a lens part 15, a frame 18, and a holding member 19. The lens part 15 is installed on the optical sub-assembly substrate 11 and optically coupled to the optical receptacle 4 through the plurality of optical fibers 30. The frame 18 fixes the lens part 15 to the optical sub-assembly substrate 11. The holding member 19 holds the ferrule 50. The holding member 19 is a component that surrounds the ferrule 50 to hold the ferrule 50 in the inside of the optical sub-assembly 10. The holding member 19 includes a first frame part 19a that is located on the front side and a second frame part 19b that is located on the rear side. The first frame part 19a and the second frame part 19b are both in a frame shape opened upwards. In the second frame part 19b, the lens part 15 and the rear part of the ferrule 50 are accommodated, and in the first frame part 19a, the front part of the ferrule 50 is accommodated. The length of the first frame part 19a in the one direction D1 is shorter than the length of the second frame part 19b in the one direction D1, and the length of the first frame part 19a in the direction D2 is longer than the length of the second frame part 19b in the direction D2.

The first frame part 19a has a pair of front walls 19c that is arrayed along the direction D2, a pair of side walls 19d that extends from the end parts of the front walls 19c in the direction D2 to the rear side, and a rear wall 19e that extends from the rear ends of the side walls 19d in the direction D2 to the inner side. On the inner side of the pair of front walls 19c in the direction D2, an inclination part 19f that is inclined to the rear side is formed. Between a pair of inclination parts 19f, an insertion member 19g in a frame shape into which the set of optical fibers 30 on the lower side going from the ferrule 40 to the ferrule 50 is inserted in the one direction D1 is provided. The side walls 19d extend along the one direction D1, and a space S is formed between the inner surfaces of the side walls 19d and the ferrule 50. At the inner end part of the rear wall 19e in the direction D2 continues to the front end of the second frame part 19b.

The second frame part 19b has a pair of side surface parts 19h that extends from the rear walls 19e of the first frame part 19a to the rear side, and a rear part 19j that is located on the opposite side to the first frame part 19a of the pair of side surface parts 19h. From the top ends of the pair of side surface parts 19h and the rear part 19j, a cover part 19k that extends on the inner side of the second frame part 19b is formed. The cover part 19k covers a part of the ferrule 50 and a part of the lens part 15. The cover part 19k extends in the one direction D1 in the side surface parts 19h and extends in the direction D2 in the rear part 19j. The cover part 19k covers the both ends of the ferrule 50 in the direction D2, the both ends of the lens part 15 in the direction D2, and the rear end of the lens part 15. The rear part 19j has a through hole through which the plurality of optical fibers 30 is passed in the one direction D1.

Figure 4:
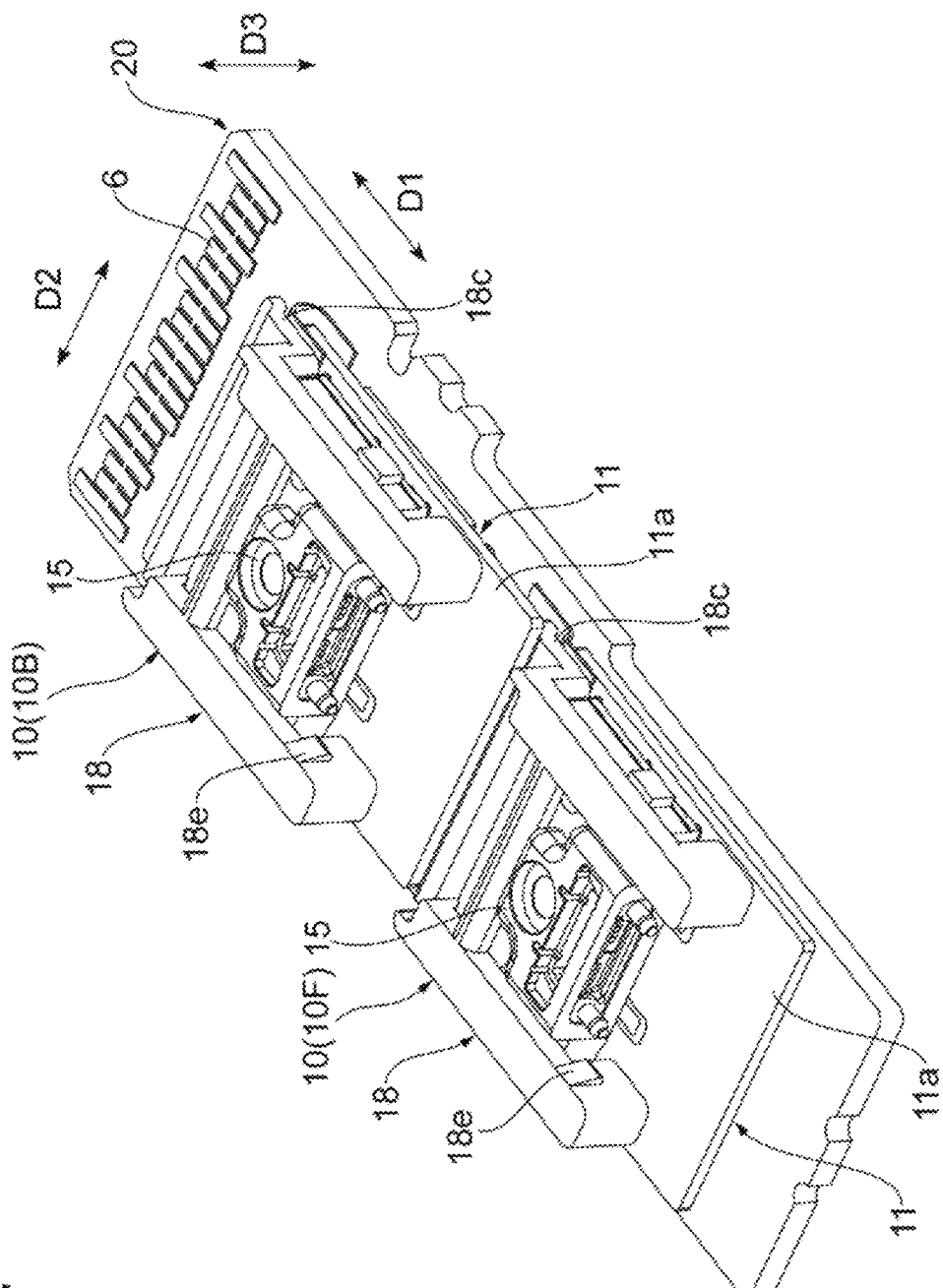
FIG. 4 is a perspective view showing the two optical sub-assemblies and the circuit board in FIG. 3.
Figure 5:
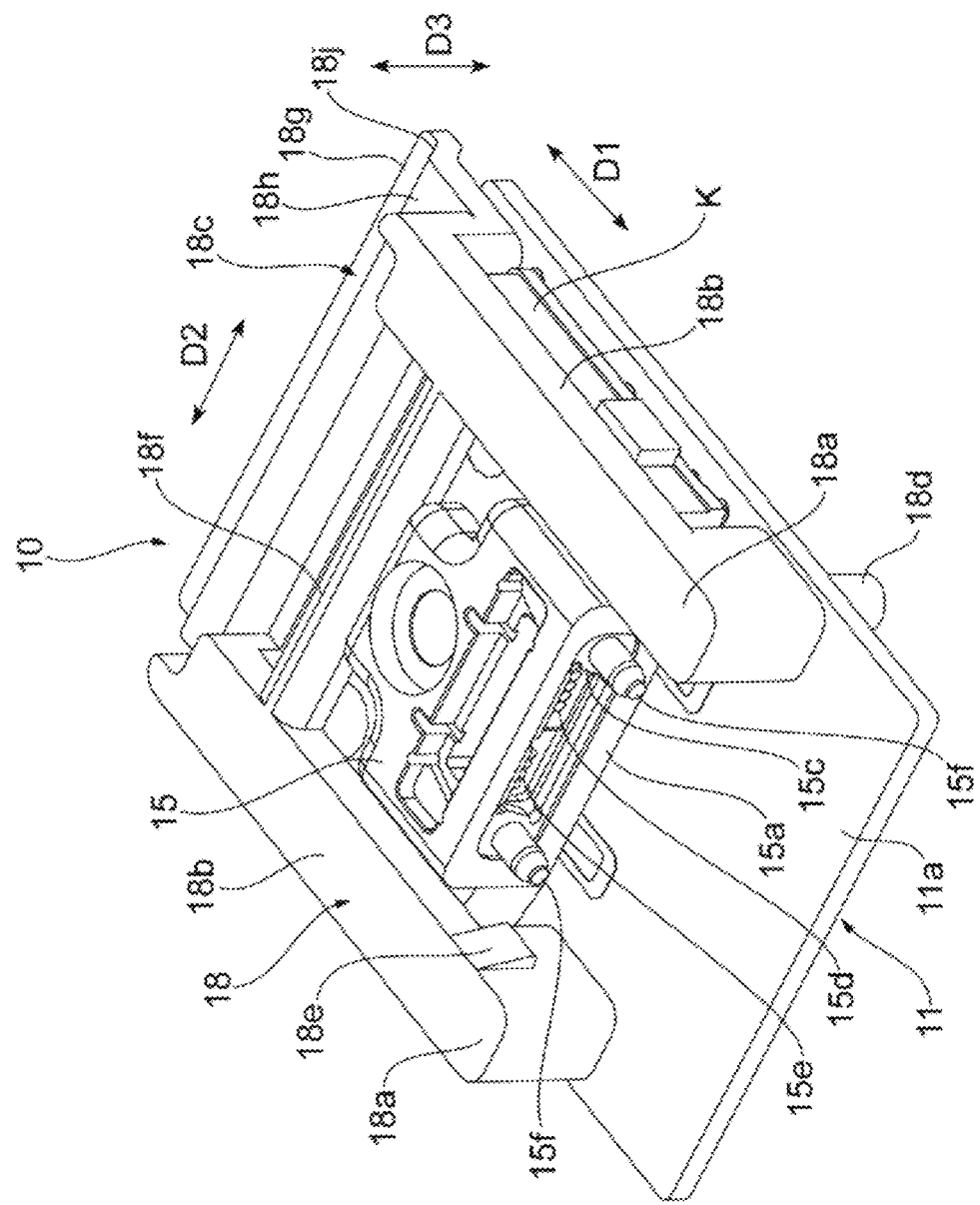
FIG. 5 is a perspective view showing the optical sub-assemblies in FIG. 3.

FIG. 4 is a perspective view showing the two optical sub-assemblies 10 from which the holding member 19 is removed and the circuit board 20. FIG. 5 is a perspective view of the optical sub-assembly substrate 11, the lens part 15, and the frame 18 of the optical sub-assemblies 10 viewed from above. As shown in FIG. 4, the two optical sub-assemblies 10 are disposed being arrayed along the one direction D1. The optical sub-assembly substrate 11 of the optical sub-assembly 10B is placed on the rear end of the frame 18 of the optical sub-assembly 10F. The lens part 15 is disposed on the inner side of the frame 18, installed on a top surface 11a (upper surface) of the optical sub-assembly substrate 11, and retained by the frame 18. The top surface 11a is a surface directed to the upper housing 7 of the optical sub-assembly substrate 11 when the optical sub-assembly 10 is placed (installed) in the inside of the housing 2. The area of the top surface 11a of the optical sub-assembly substrate 11 is smaller than the area of the top surface 20c of the circuit board 20. For example, the area of the top surface 11a is smaller than a half of the area of the top surface 20c.

Figure 6:
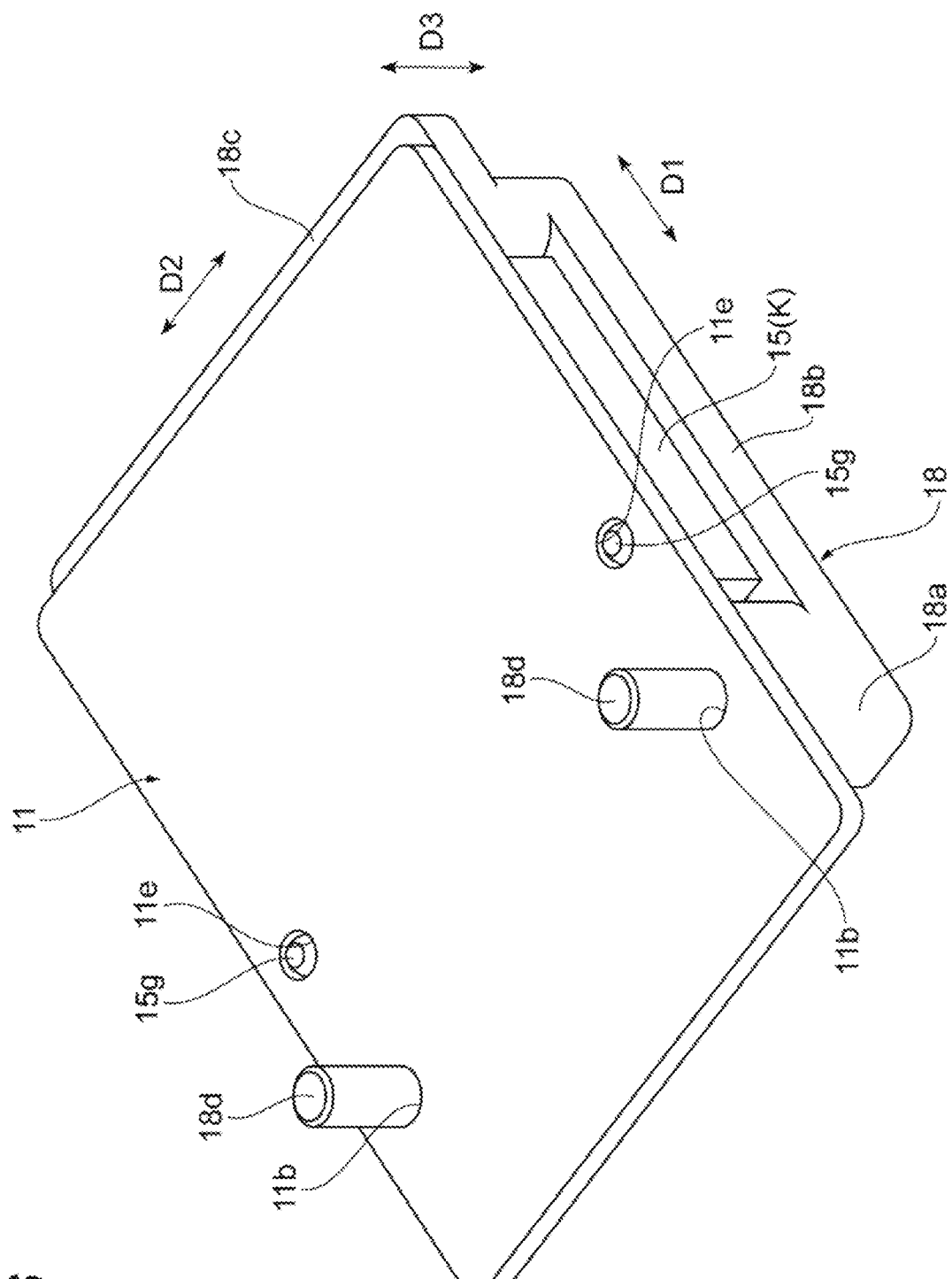
FIG. 6 is a perspective view showing the optical sub-assemblies in FIG. 5 viewed from the opposite side to the view in FIG. 5.
Figure 7:
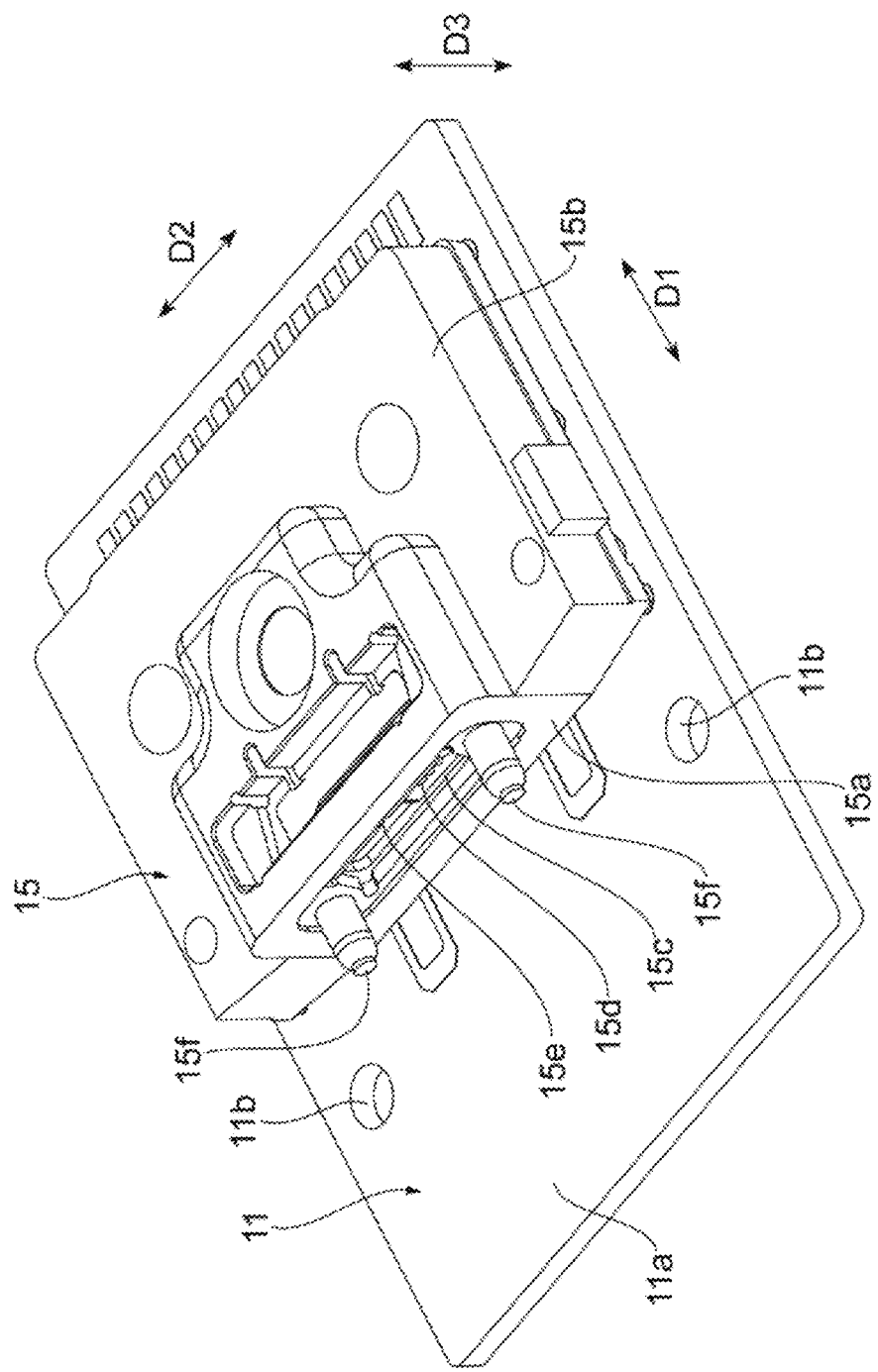
FIG. 7 is a perspective view showing the optical sub-assembly substrate of the optical sub-assemblies in FIG. 5 and a lens part.

FIG. 6 is a perspective view of the optical sub-assembly substrate 11, the lens part 15, and the frame 18 viewed from below. FIG. 7 is a perspective view showing the optical sub-assembly substrate 11 and the lens part 15. As shown in FIGS. 5, 6, and 7, the frame 18 includes a pair of front parts 18a that are placed on the top surface 11a of the optical sub-assembly substrate 11 and arrayed along the direction D2, a pair of side parts 18b individually extends from the pair of front parts 18a to the rear side, and a rear part 18c that connects the rear ends of the pair of side parts 18b to each other. The pair of front parts 18a each include a boss 18d that projects downwards and a tapered part 18e that projects on the inner side of the direction D2. The bosses 18d engages with (is fit into) the through hole 11b formed on the optical sub-assembly substrate 11, the bosses 18d engage with the through holes 11b, and thus the frame 18 is fixed to the optical sub-assembly substrate 11. By fitting the bosses 18d into the through hole 11b, the mounting position of the frame 18 on the top surface 11a is determined. The tapered parts 18e have a tapered surface that projects on the inner side of the direction D2 obliquely downwards. The tapered parts 18e each enter the through hole formed on the side surface part 19h of the holding member 19, and thus the holding member 19 is fixed to the frame 18.

The side parts 18b extend from the upper parts of the front parts 18a to the rear side, and between the side parts 18b and the top surface 11a of the optical sub-assembly substrate 11, a space K is formed from which the side part of the lens part 15 is exposed. The frame 18 includes a bridging part 18f that extends from the midway point of the side part 18b in the one direction D1 in the direction D2, and the bridging part 18f is disposed so as to cross the pair of side parts 18b above the lens part 15. The bridging part 18f is located between the front parts 18a and the rear part 18c in the one direction D1. The rear part 18c is provided at the position close to a position lower from the side part 18b (at the position close to the optical sub-assembly substrate 11). The rear part 18c is in a step form having steps along the one direction D1. The rear part 18c has a lower step part 18g that is located on the rear side, an upper step part 18h that is located on the front side from the lower step part 18g, and an inclination part 18j that is inclined both in the one direction D1 and in the direction D3 between the lower step part 18g and the upper step part 18h. The lower step part 18g, the inclination part 18j, and the upper step part 18h all extend along the direction D2.

Figure 8:
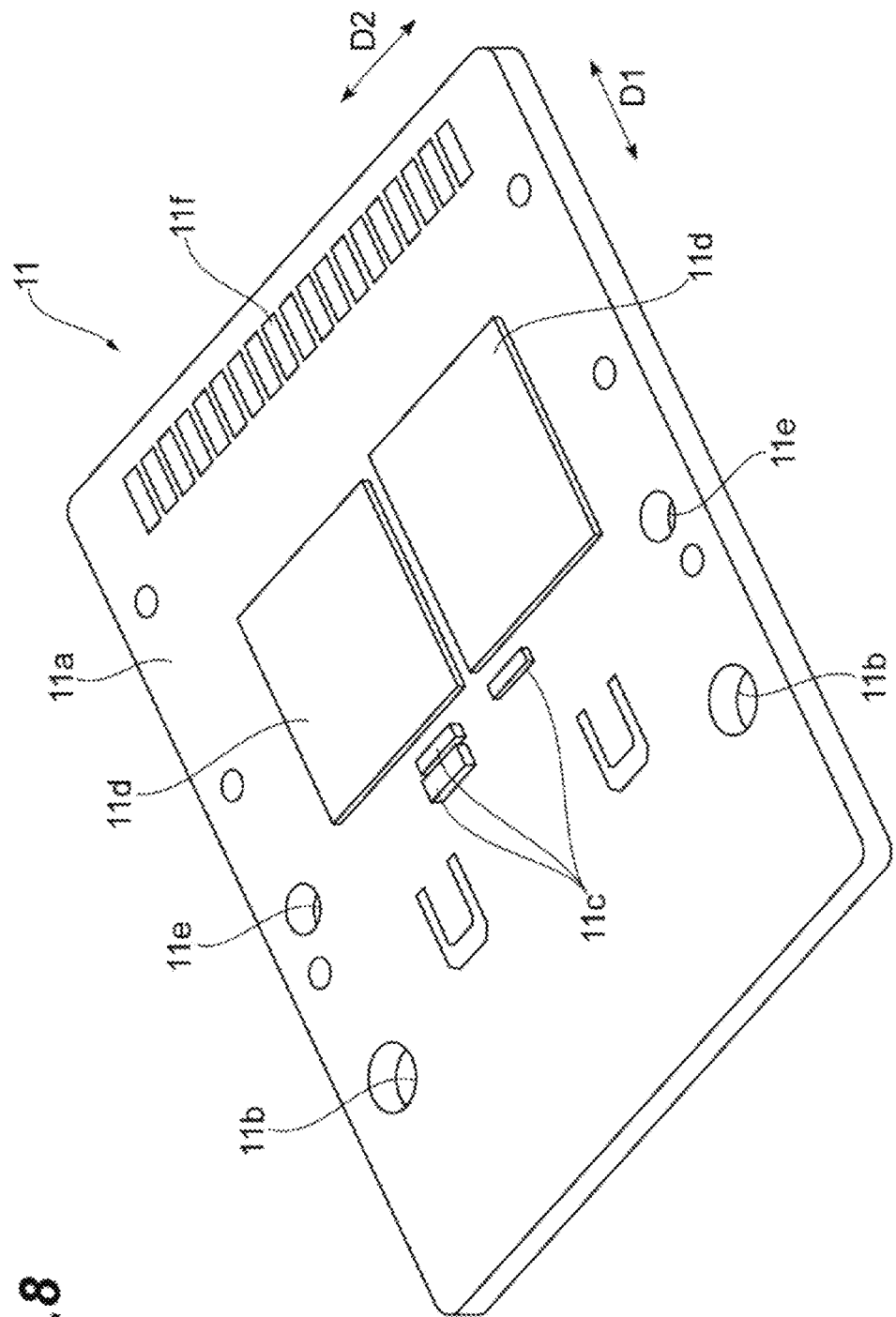
FIG. 8 is a perspective view showing the optical sub-assembly substrate in FIG. 7.

FIG. 8 is a perspective view showing the top surface 11a of the optical sub-assembly substrate 11. As shown in FIGS. 7 and 8, the lens part 15 is a resin block, for example, and installed on the top surface 11a. The optical sub-assembly substrate 11 is a printed circuit board, for example. However, the optical sub-assembly substrate 11 is not limited to the printed circuit board, and may be a semiconductor substrate. On the top surface 11a, optical devices 11c and electronic devices 11d are mounted, for example. The lens part 15 covers the optical device 11c and the electronic device 11d mounted on the top surface 11a. The optical device 11c includes any of or both of a light emitting element and a light receiving element, for example. This light emitting element is a VCSEL (vertical-cavity surface-emitting laser) that is one kind of semiconductor laser diodes, for example Among the light receiving elements, one included in the optical device 11c together with the light emitting element is a monitor photodiode, for example. The light emitting element converts electrical signals (transmission electrical signals) into optical signals for transmission. Other than the monitor photodiode, the light receiving element includes elements that convert optical signals into electrical signals (reception electrical signals) at high speed, such as an avalanche photodiode (APD) or a PIN photodiode (PIN-PD). The APD and the PIN-PD may be used as the optical device 11c alone. The electronic device 11d includes a drive circuit that drives the light emitting element and an amplifier circuit that amplifies electrical signals outputted from various photodiodes including the light receiving element. Note that on the optical sub-assembly substrate 11, circuits other than the circuits may be further provided.

The lens part 15 is made of a transparent resin that transits light emitted from the light emitting element of the optical device 11c, and is made of ULTEM (registered trademark), for example. The lens part 15 has a front part 15a and an upper part 15b, and from the front part 15a, the optical port 15c is exposed in the center part in the direction D2. From the optical port 15c, a lens array 15d corresponding to the light emitting element of the optical device 11c and a lens array 15e corresponding to the light receiving element of the optical device 11c are exposed. The lenses of the lens array 15d and the lens array 15e are optically coupled to the optical fibers 30 retained the ferrule 50 through the optical port 15c. On the both end sides of the direction D2 in which the lens array 15d and the lens array 15e are arrayed, a pair of the guide pins 15f is provided. The guide hole of the ferrule 50 is fit into each of the pair of the guide pins 15f, the ferrule 50 engages with the lens part 15, and the lens part 15 is optically coupled to the optical fibers 30.

As shown in FIGS. 6 and 8, on the optical sub-assembly substrate 11, a pair of through holes 11e that is arrayed along the direction D2 is formed. With each of the pair of through holes 11e, the boss 15g projecting from the lower part of the lens part 15 engages. The bosses 15g engage with the through holes 11e, and the lens part 15 is fixed to the top surface 11a of the optical sub-assembly substrate 11. The boss 15g is fit into the through hole 11e, and thus the mounting position of the lens part 15 on the top surface 11a is determined. On the rear part of the top surface 11a, a plurality of pads 11f that is arrayed along the direction D2 is provided.

Figure 9:
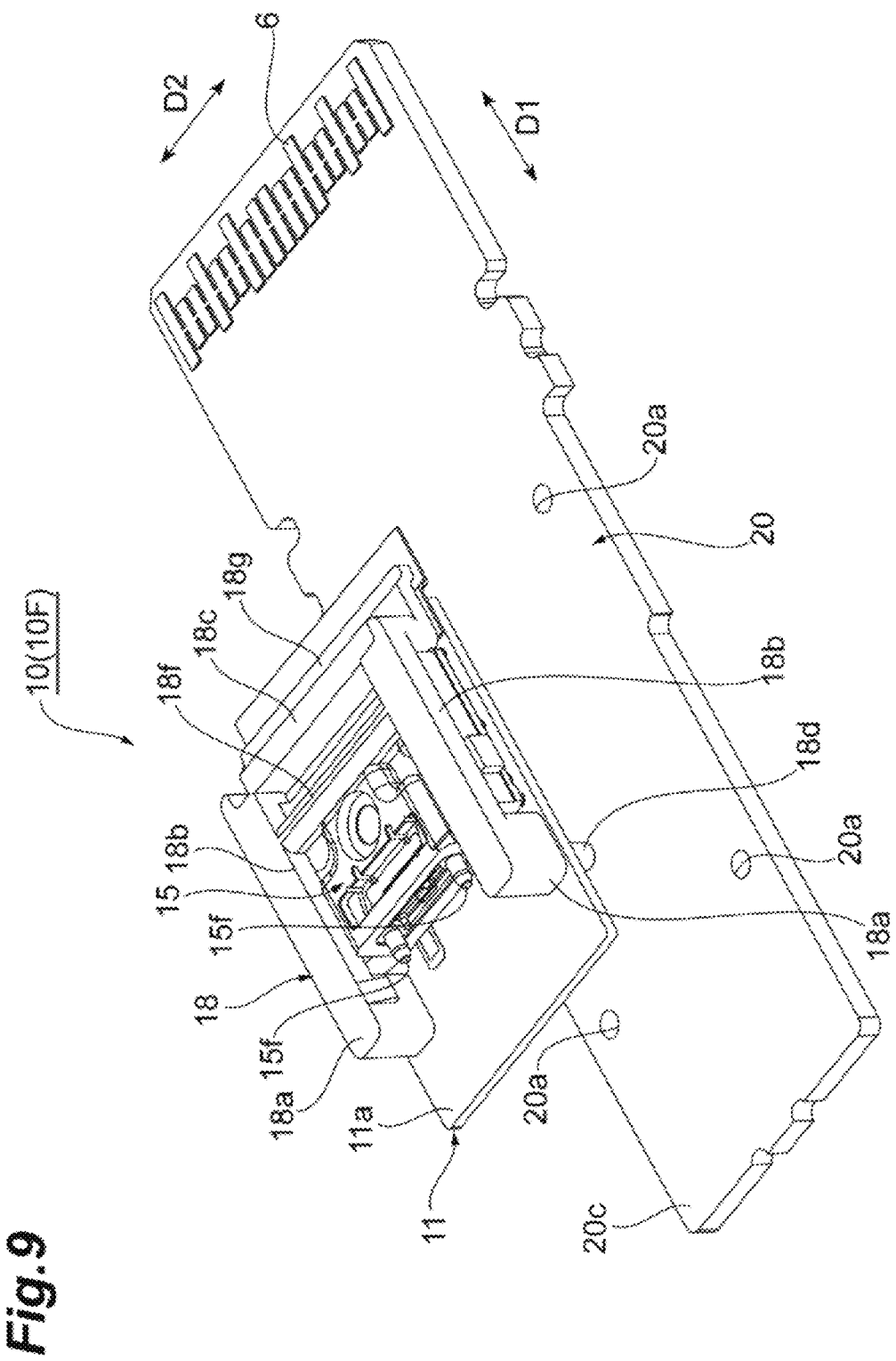
FIG. 9 is a perspective view showing a state before the optical sub-assemblies are installed on the circuit board in FIG. 3.
Figure 10:
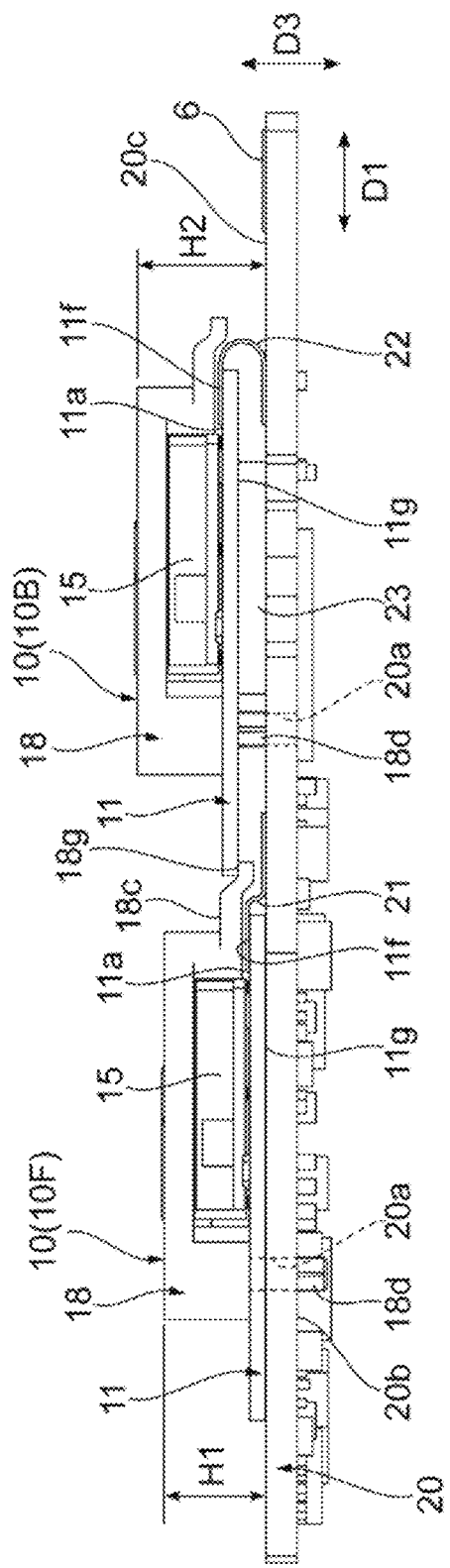
FIG. 10 is a side view showing the two optical sub-assemblies and the circuit board in FIG. 3.

FIG. 9 is a perspective view showing the state before the optical sub-assembly 10 is installed on the circuit board 20. FIG. 10 is a side view showing the state in which the two optical sub-assemblies 10 are installed on the circuit board 20. The circuit board 20 has an under surface 20b that has a straight line in parallel with the direction D3 as its normal and a top surface 20c that has a straight line in parallel with direction D3 as its normal and is located on the opposite side to the under surface 20b. When the circuit board 20 is placed (installed) in the inside of the housing 2, the top surface 20c is directed to the upper housing 7, and the under surface 20b is directed to the lower housing 8. The optical sub-assembly 10 is installed on the top surface 20c. As shown in FIGS. 8, 9, and 10, to the pads 11f on the optical sub-assembly substrate 11 on the front side (in FIG. 10, on the left side), a first FPC 21 is connected. The pads 11f are electrically connected to the circuit board 20 through the first FPC 21. On the circuit board 20, a plurality of holes 20a that opens upwards is formed. Two sets of two holes 20a that are arrayed along the direction D2 are arrayed along the one direction D1. With the two holes 20a that are arrayed along the direction D2, the bosses 18d of the frame 18 that project below the optical sub-assembly substrate 11 individually engage. The bosses 18d of the frame 18 engage with the holes 20a on the circuit board 20, and the optical sub-assembly 10 is fixed to the circuit board 20. The boss 18d is fit into the hole 20a, and thus the mounting position of the optical sub-assembly 10 on the top surface 20c is determined.

To the pads 11f on the optical sub-assembly substrate 11 on the rear side (in FIG. 10, on the right side), a second FPC 22 in a U-shape is connected. The pads 11f are electrically connected to the circuit board 20 through the second FPC 22. The front end of the optical sub-assembly substrate 11 of the optical sub-assembly 10B is placed on the rear end of the frame 18 of the optical sub-assembly 10F. That is, the front end of the optical sub-assembly substrate 11 on the rear side is placed on the lower step part 18g of the rear part 18c of the frame 18 on the front side. Therefore, the optical sub-assembly 10F is mourned on the circuit board 20 prior to the optical sub-assembly 10B. With the two holes 20a on the rear side of the circuit board 20 arrayed along the direction D2, the bosses 18d of the frame 18 that project below the optical sub-assembly substrate 11 on the rear side engage.

The boss 18d of the optical sub-assembly 10F and the boss 18d of the optical sub-assembly 10B both engage with the holes 20a on the circuit board 20. However, between the optical sub-assembly 10F and the optical sub-assembly 10B, the length of the penetrating part of the boss 18d to the circuit board 20 is different. The boss 18d of the optical sub-assembly 10F is inserted into the hole 20a deeper than the boss 18d of the optical sub-assembly 10B. In regard to the projecting amount of the boss 18d from the under surface 20b of the circuit board 20, the boss 18d of the optical sub-assembly 10F has the projecting amount longer than that of the boss 18d of the optical sub-assembly 10B. A height H2 of the optical sub-assembly 10B to the circuit board 20 is higher than a height H1 of the optical sub-assembly 10F to the circuit board 20. Alternatively, the distance between the under surface 11g of the optical sub-assembly 10F and the top surface 20c of the circuit board 20 is shorter than the distance between the under surface 11g of the optical sub-assembly 10B and the top surface 20c of the circuit board 20.

In regard to the installation of the optical sub-assembly 10B on the circuit board 20, first, one end of the second FPC 22 in a planar shape is fixed to the circuit board 20. The other end of the second FPC 22 is fixed to the top surface 11a of the optical sub-assembly substrate 11, the under surface 11g of the optical sub-assembly substrate 11 is directed to upwards, and a state is achieved in which the upside of the optical sub-assembly 10 is down. In this state, a heat dissipation sheet 23 is placed on the optical sub-assembly substrate 11 on the rear side and the position of the top surface 20c of the circuit board 20 at which the lens part 15 is placed. The optical sub-assembly substrate 11 side of the second FPC 22 is bent to form the second FPC 22 in a U-shape, the under surface 11g of the optical sub-assembly substrate 11 is placed on the heat dissipation sheet 23, and the boss 18d that projects downwards from the optical sub-assembly substrate 11 engages with the hole 20a on the circuit board 20. At this time, the front end of the optical sub-assembly substrate 11 is placed on the rear end of the optical sub-assembly 10F, and the installation of the optical sub-assembly 10B on the circuit board 20 is completed.

Figure 11:
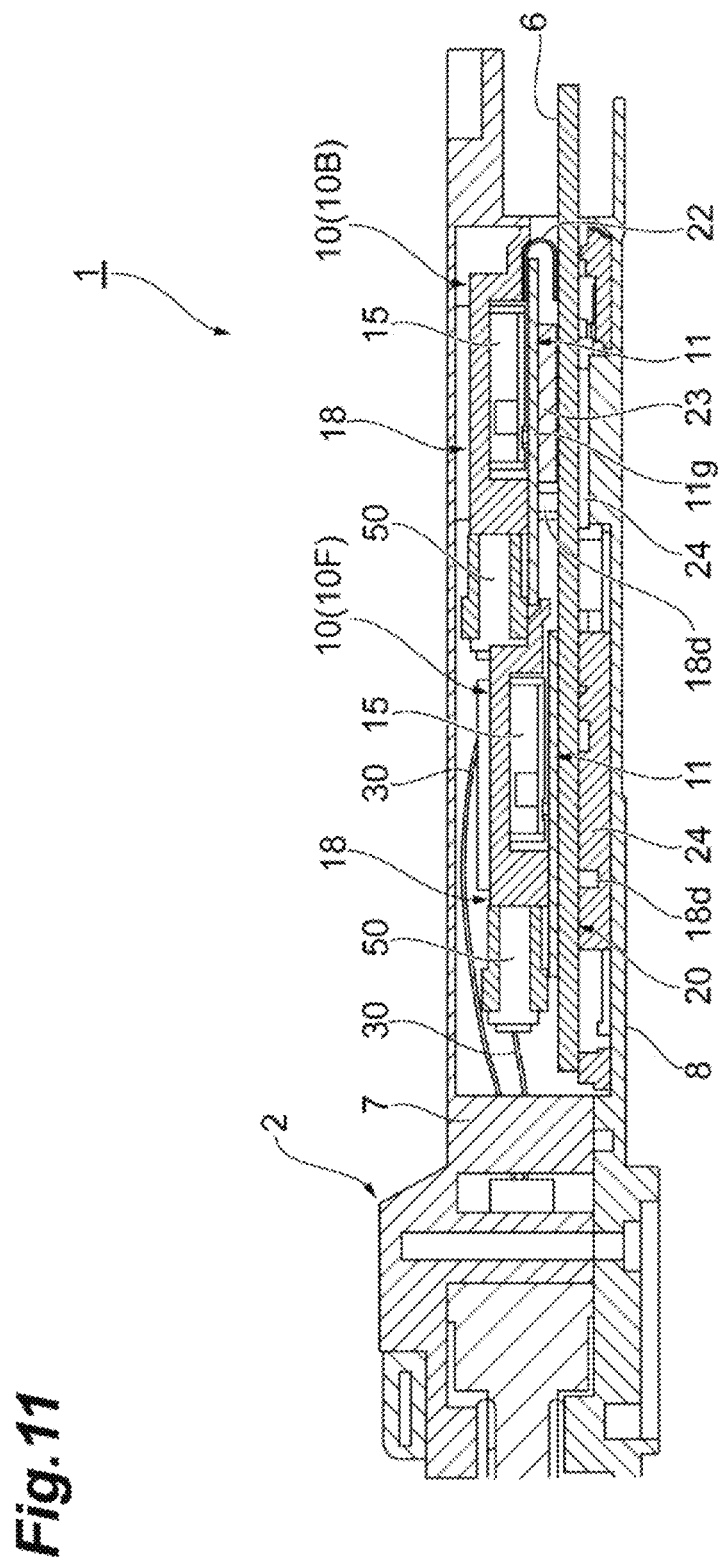
FIG. 11 is a cross sectional view of the optical transceiver in FIG. 1.

FIG. 11 is a front-to-rear sectional view when the optical transceiver 1 is cut at a plane in parallel with the one direction D1 and the direction D3. As shown in FIGS. 10 and 11, when the installation described above is performed, the heat dissipation sheet 23 is interposed between the circuit board 20 and the optical sub-assembly 10B. With the heat dissipation sheet 23, the passage of heat dissipation from the optical sub-assembly 10B to the circuit board 20 is reserved. Between the circuit board 20 and the optical sub-assembly 10F, a heat dissipation sheet or heat dissipation gel that is thinner than the heat dissipation sheet 23 is interposed, and the passage of heat dissipation from the optical sub-assembly 10F to the circuit board 20 is reserved. Between the circuit board 20 and the inner surface of the lower housing 8, a heat dissipation sheet 24 is interposed, and with the heat dissipation sheet 24, the passage of heat dissipation from the circuit board 20 to the outside of the housing 2 (the lower housing 8) is reserved. The optical device 11c and the electronic device 11d installed on the optical sub-assembly 10 generate Joule heat in operation after electric power is carried. In order to suppress an excess increase in the temperatures of the optical device 11c and the electronic device 11d, the generated Joule heat is released to the outside of the housing 2 through the heat dissipation passage described above. The circuit board 20 is provided with the electrical plug 6 on the opposite side to the optical receptacle 4 in the one direction D1. On the circuit board 20, electronic circuits are formed using a plurality of ICs and circuit elements, transmission electrical signals are received from the host system through the electrical plug, and reception electrical signals are transmitted to the host system through the electrical plug. The transmission electrical signals are sent to the optical sub-assembly 10 through the first FPC 21 or the second FPC 22, and converted into optical signals by the optical sub-assembly 10. The reception electrical signals that are converted from the optical signals externally received from the optical sub-assembly 10 are sent to the circuit board 20 through the first FPC 21 or the second FPC 22. On the circuit board 20, signal processing circuits, such as a circuit clock data recovery (CDR) may be installed for waveform shaping of transmission electrical signals or reception electrical signals, for example. On the circuit board 20, a micro controller, for example, that controls the inside of the optical transceiver 10 or that performs serial data communication with the host system for monitoring and controlling may be installed.

Next, the operation and the effect obtained from the optical transceiver 1 will be described in detail. The optical transceiver 1 includes the optical sub-assembly 10F (first optical sub-assembly) and the optical sub-assembly 10B (second optical sub-assembly). These two optical sub-assemblies 10 both include the optical devices 11c. Therefore, the data capacity can be increased, compared with an optical transceiver including one optical sub-assembly, and thus a large data capacity can be achieved. The optical transceiver 1 is hot swapped to the cage of the host system in the one direction D1. The optical receptacle 4, the optical sub-assembly 10F, and the optical sub-assembly 10B are disposed being arrayed along the one direction D1 in this order. The optical receptacle 4, the optical sub-assembly 10F and the optical sub-assembly 10B are disposed being arrayed along the one direction D1 in this manner, the optical sub-assembly 10 can be efficiently accommodated in the inside of the housing 2, and thus a reduction in size can be maintained.

The optical sub-assembly 10F and the optical sub-assembly 10B each include the optical sub-assembly substrate 11, the lens part 15, and the frame 18 that fixes the lens part 15 to the optical sub-assembly substrate 11. A part of the frame 18 of the optical sub-assembly 10F (e.g. the lower step part 18g of the rear part 18c) is pressed by the optical sub-assembly substrate 11 of the optical sub-assembly 10B toward the circuit board 20. In the optical sub-assembly 10F and the optical sub-assembly 10B thus arrayed along the one direction D1, a part of the frame 18 of the optical sub-assembly 10F is pressed by the optical sub-assembly substrate 11 of the optical sub-assembly 10B. Thus, the optical sub-assembly 10F and the optical sub-assembly 10B can be installed such that the optical sub-assembly 10F and the optical sub-assembly 10B are overlapped with each other in the one direction D1, and the lengths of the two optical sub-assemblies 10 in the one direction D1 can be suppressed. Therefore, the length of the optical transceiver 1 in the one direction D1 can be suppressed, and thus a reduction in size of the optical transceiver 1 can be achieved.

The optical sub-assembly 10F and the optical sub-assembly 10B have the same outer shape. Therefore, optical sub-assemblies in the same outer shape can be used as the optical sub-assembly 10F and the optical sub-assembly 10B, and thus the components of the optical transceiver 1 can be common components. Therefore, using common components is advanced and thus, costs on components can be decreased.

The frame 18 has the boss 18d that penetrates through the optical sub-assembly substrate 11 and engages with the hole 20a formed on the circuit board 20. The optical sub-assemblies 10 are fixed to the circuit board 20 by the engagement of the boss 18d with the hole 20a. Therefore, the frame 18 that fixes the lens part 15 includes the boss 18d that penetrates through the optical sub-assembly substrate 11 and engages with the hole 20a on the circuit board 20. Therefore, the optical sub-assembly substrate 11 can be fixed to the circuit board 20 using the boss 18d of the frame 18 that fixes the lens part 15. Therefore, the optical sub-assembly 10 to the circuit board 20 can be positioned. The lens part 15 can be fixed to the optical sub-assembly substrate 11 using the frame 18, and the optical sub-assembly substrate 11 can be fixed to the circuit board 20.

The height H2 of the optical sub-assembly 10B to the circuit board 20 (the distance between the circuit board 20 and the optical sub-assembly 10B) is higher than the height H1 of the optical sub-assembly 10F to the circuit board 20 (the distance between the circuit board 20 and the optical sub-assembly 10F). That is, the height H2 of the optical sub-assembly 10B located on the opposite side to the optical receptacle 4 is higher than the height H1 of the optical sub-assembly 10 located on the optical receptacle 4 side. In other words, the distance between the circuit board 20 and the optical sub-assembly 10B is longer than the distance between the circuit board 20 and the optical sub-assembly 10F. As described above, the height H2 of the optical sub-assembly 10 located on the opposite side to the optical receptacle 4 is higher, and thus the bending radius of the plurality of optical fibers 30 (the second multicore optical fiber) extending from the optical receptacle 4 to the optical sub-assembly 10B can be increased. If it is assumed that the height of the optical sub-assembly 10B is the same as the height H1 of the optical sub-assembly 10F, the plurality of optical fibers 30 extending from the optical receptacle 4 to the optical sub-assembly 10B bends above and below (in the direction D3) when crossing the optical sub-assembly 10F, and thus the bending radius of each of the optical fibers 30 is reduced. In contrast, in the case in which the height H2 of the optical sub-assembly 10B is higher than the height H1 of the optical sub-assembly 10F, the degree of the bend of the plurality of optical fibers 30 extending from the optical receptacle 4 to the optical sub-assembly 10B in the vertical direction can be reduced. Consequently, the bending radius of the plurality of optical fibers 30 can be increased. Therefore, the bending radius of the plurality of optical fibers 30 can surely achieve the values of the specification or more, and thus the bending loss of the optical fiber 30 can be more surely suppressed.

The optical transceiver 1 includes the heat dissipation sheet 23 that is interposed between the circuit board 20 and the optical sub-assembly 10B. Therefore, the heat dissipation sheet 23 is interposed between the optical sub-assembly 10B having the height H2 to the circuit board 20 higher than the optical sub-assembly 10F and the circuit board 20. Therefore, the heat dissipation passage can be formed among the optical sub-assembly 10B that is located at a higher position, the heat dissipation sheet 23, and the circuit board 20, and thus the passage of heat dissipation from the optical sub-assembly 10B can be surely reserved.

As described above, the embodiment of the optical transceiver according to the present disclosure is described. However, the present invention is not limited to the foregoing embodiment. That is, a person skilled in the art easily recognizes that various modifications and alterations can be made within the gist of the present invention described in claims For example, the shapes, sizes, materials, numbers, and disposition forms of the components of the optical transceiver can be appropriately changed.

For example, in the foregoing embodiment, the plurality of optical fibers 30 partially including at least a tape part is described. However, the plurality of optical fibers that connects the ferrules to each other does not necessarily formed in a tape. In the foregoing embodiment, an example is described in which 24 optical fibers 30 and the ferrule 40 constitute a 24-core MPO connector, and an example is described in which 12 optical fibers 30 and the ferrule 50 constitute a 12-core MPO connector. However, the number (the core number) of the optical fibers may include 16 or 32, for example, which can be appropriately changed. Optical connectors other than the MPO connector may be included. In the foregoing embodiment, the optical transceiver 1 in compliance with the QSFP specification is described. However, the optical transceiver according to the present disclosure may be optical transceivers in compliance with the specifications other than the QSFP specification, such as the SFP specification, for example.

What is claimed is:

1. An optical transceiver configured to be plugged into a cage of an apparatus in a first direction, the optical transceiver comprising:
    an optical receptacle configured to receive an external optical connector;
    a circuit board having a first side, the circuit board including an electric circuit processing an electrical signal;
    a first optical sub assembly (OSA) and a second OSA each including:
        a sub-board having an upper surface, the upper surface having an area smaller than an area of the first side of the circuit board;
        an optical device mounted on the upper surface, the optical device configured to perform an conversion between the electrical signal and an optical signal ;
        an optical block mounted on the upper surface, the optical block being optically coupled with the optical device; and
        a frame configured to fix the optical block on the upper surface;
    a first optical fiber coupling the first OSA with the optical receptacle;
    a second optical fiber coupling the second OSA with the optical receptacle; and
    a housing including the circuit board, the first OSA, the second OSA, the first optical fiber, and the second optical fiber;
    wherein the first OSA is located between the optical receptacle and the second OSA in the first direction on the first side of the circuit board, and
    wherein the second OSA pushes the first OSA toward the first side of the circuit board.

2. An optical transceiver according to claim 1,
    wherein the first OSA and the second OSA have a same outer shape.

3. An optical transceiver according to claim 2,
    wherein the area of the upper surface is smaller than a half of the area of the first side.

4. An optical transceiver according to claim 1, further including a first flexible printed circuit (FPC) and a second FPC,
    wherein the first OSA is electrically coupled with the circuit board through the first FPC, and
    wherein the second OSA is electrically coupled with the circuit board through the second FPC.

5. An optical transceiver according to claim 1,
    wherein the circuit board has a plurality of holes on the upper surface,
    wherein the frame has a plurality of bosses that penetrates through the sub-board, and
    wherein each of the first OSA and the second OSA is fixed to the circuit board by engagement of the plurality of bosses with the plurality of holes, each of the first OSA and the second OSA having the plurality of bosses.

6. An optical transceiver according to claim 1,
    wherein a distance between the circuit board and the second OSA is longer than a distance between the circuit board and the first OSA.

7. An optical transceiver according to claim 6, further comprising
    a heat dissipation sheet interposed between the circuit board and the second OSA.

* * * * *